(12) United States Patent
Liang et al.

(10) Patent No.: US 10,826,613 B1
(45) Date of Patent: Nov. 3, 2020

(54) INTEGRATED COMPACT IN-PACKAGE LIGHT ENGINE

(71) Applicant: INPHI CORPORATION, Santa Clara, CA (US)

(72) Inventors: Ding Liang, Westlake Village, CA (US); Mark Patterson, Santa Clara, CA (US); Roberto Coccioli, Santa Clara, CA (US); Radhakrishnan L. Nagarajan, Santa Clara, CA (US)

(73) Assignee: INPHI CORPORATION, San Jose, CA (US)

( * ) Notice: Subject to any disclaimer, the term of this patent is extended or adjusted under 35 U.S.C. 154(b) by 0 days.

(21) Appl. No.: 16/706,450

(22) Filed: Dec. 6, 2019

(51) Int. Cl.
| | | |
|---|---|---|
| *H04B 10/40* | (2013.01) | |
| *G02B 6/42* | (2006.01) | |
| *H01S 5/022* | (2006.01) | |
| *H01S 5/02* | (2006.01) | |
| *G02F 1/313* | (2006.01) | |
| *H01S 5/12* | (2006.01) | |
| *H04J 14/02* | (2006.01) | |

(52) U.S. Cl.
CPC ............ *H04B 10/40* (2013.01); *G02B 6/425* (2013.01); *H01S 5/021* (2013.01); *H01S 5/0224* (2013.01); *G02F 1/3136* (2013.01); *G02F 2201/02* (2013.01); *H01S 5/12* (2013.01); *H04J 14/0221* (2013.01)

(58) Field of Classification Search
None
See application file for complete search history.

(56) References Cited

U.S. PATENT DOCUMENTS

| | | | | |
|---|---|---|---|---|
| 9,071,364 | B1 * | 6/2015 | Voois | H04B 10/2507 |
| 9,496,959 | B1 * | 11/2016 | Nagarajan | G02B 6/4271 |
| 9,853,734 | B1 * | 12/2017 | Fan | H04B 10/40 |
| 10,181,899 | B2 * | 1/2019 | Fan | H04B 10/61 |
| 2004/0033004 | A1 * | 2/2004 | Welch | H04B 10/50 |
| | | | | 385/14 |
| 2008/0044128 | A1 * | 2/2008 | Kish, Jr. | G02B 6/12004 |
| | | | | 385/14 |
| 2011/0243556 | A1 * | 10/2011 | Nagarajan | H04B 10/40 |
| | | | | 398/43 |

(Continued)

*Primary Examiner* — Jerry Rahll
(74) *Attorney, Agent, or Firm* — Richard T. Ogawa; Ogawa P.C.

(57) ABSTRACT

An integrated compact light engine configured in a on-board in-package optics assembly. The compact light engine includes a single substrate to integrate multiple optical-electrical modules. Each optical-electrical module includes an integrated optical transceiver based on silicon-photonics platform, in which a transmit path configured to output four light signals centered at four CWDM wavelengths and from four laser devices and to modulate the four light signals respectively by four modulators driven by a driver chip and to deliver a multiplexed transmission light. A receive path includes a photodetector to detect four input signals demultiplexed from an incoming light and a trans-impedance amplifier chip to process electrical signals converted from the four input signals detected. A multi-channel light engine is formed by co-integrating or co-mounting a switch device with multiple compact light engines on a common substrate member to provide up to 51.2 Tbit/s total capacity of data communication with median-or-short-reach electrical interconnect.

38 Claims, 7 Drawing Sheets

(56) References Cited

U.S. PATENT DOCUMENTS

2017/0257168 A1* 9/2017 Gopalakrishnan ...... H04L 25/00
2018/0067888 A1* 3/2018 Sheth .................. G06F 13/4282
2019/0165200 A1* 5/2019 Masini ................. H01L 31/147
2020/0076720 A1* 3/2020 Riani .................... H04L 1/0057

* cited by examiner

INTEGRATED COMPACT IN-PACKAGE LIGHT ENGINE

BACKGROUND OF THE INVENTION

The present invention relates to optical telecommunication techniques. More particularly, the present invention provides a compact optical transceiver based on silicon photonics platform, a light engine with compact on-board in-package optics assembly, or a light engine integrated with a switch device in a co-packaged optics assembly, and an optical-electrical system having the same.

As science and technology are updated rapidly, processing speed and capacity of the computer increase correspondingly. The communication transmission or reception using the traditional cable is limited to bandwidth and transmission speed of the traditional cable and mass information transmission required in modern life causes the traditional communication transmission overload. To correspond to such requirement, the optical fiber transmission system replaces the traditional communication transmission system gradually. The optical fiber communication is chosen for systems requiring higher bandwidth and longer distance that electrical cable cannot accommodate. Present electronic industrial performs research toward optical transmission which will become the mainstream in the future even for short distance communication. Said optical communication is a technology in that light wave functions as signal carrier and transmitted between two nodes via the optical fiber. An optical communication system includes an optical transmitter and an optical receiver. By the optical transceiver, the received optical signal can be converted to an electrical signal capable of being processed by an IC, or the processed electrical signal can be converted to the optical signal to be transmitted via optical fiber. Therefore, objective of communication can be achieved.

Over the last few decades, the use of communication networks exploded. In the early days Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs.

40-Gbit/s and then 100-Gbit/s data rates wide-band WDM (Wavelength Division Multiplexed) optical transmission over existing single-mode fiber is a target for the next generation of fiber-optic communication networks. Chip-scale widely-tunable lasers have been of interest for many applications such as wide-band DWDM or CWDM communication and wavelength-steered light detection. More recently, optical components are being integrated on silicon (Si) substrates for fabricating large-scale photonic integrated circuits that co-exist with micro-electronic chips. a whole range of photonic components, including filters, (de)multiplexers, splitters, modulators, and photodetectors, have been demonstrated, mostly in the silicon-on-insulator (SOI) platform. The SOI platform is especially suited for standard DWDM communication bands around 1550 nm or CWDM communication band around 1310 nm, as silicon (n=3.48) and its oxide $SiO_2$ (n=1.44) are both transparent, and form high-index contrast, high-confinement waveguides ideally suited for medium to high-integration planar integrated circuits (PICs).

With the advances of optical communication technology and applications driven by the market, the demands become stronger on increasing bandwidth for optical communication and decreasing package footprint of an optical transceiver. It is more and more challenging to integrate all necessary components within smaller and smaller module package. For the state-of-art optical transceiver products, all the critical components including clock data recovery (CDRs), modulator drivers, transimpedance amplifiers (TIAs), and PLC photonics chips having optical passives, modulators, and photo detectors, are assembled side-by-side on a PCB in a 2D fashion. This approach has at least two drawbacks for developing any future optical transceiver with data rate greater than 400 G. Firstly, the side-by-side placement of the components consumes much of the board area for optical transceiver as a pluggable product or major substrate area for on-board optics product, making it very difficult to further shrink the product size. Secondly, side-by-side placement on the PCB creates longer electrical transmission length and often requires wire bonds between electrical die and photonics die, introducing more electrical loss which damages signal integrity for very high data rate transceiver product, e.g., >56 Gbaud symbol rate. In particular, the wire bonds lead to impedance mismatch due to large inductance, degrading the signal at higher frequencies. As such, it is not practical to use wirebond as electrical interconnect between chips or between chips and board for the applications where high frequency (e.g., >40 GHz) analog signal is transmitted. The large inductance of wire bonds has become a bottle neck of high-speed signal transmission.

To shorten the interconnect length of conventional wire bonds between electronics devices (e.g., from LD driver/TIA to digital signal processor DSP) or between electronics (driver/TIA) and photonics (e.g., CDR and PAM4 ASIC), people have started to use through-silicon via (TSV) process in Si photonics die to replace wire bonds and make interconnections. However, the complexity of manufacturing process, low yield, inefficient wafer area usage, and very expensive in scaling to advanced electronics making the TSV process impractical for making Si photonics field product. It is desirable to have a compact optical engine that is provided with an improved on-board package scheme that enjoys the high-performance benefit of a 3D multichip stacking integration with much shorter interconnect and lower parasitic while keeping the packaging process simple and cost low. Further the optical engine can be co-integrated with switches in high data rate communication applications to meet the requirement of ever-increasing bandwidth between electronics and photonics.

BRIEF SUMMARY OF THE INVENTION

The present invention relates to optical telecommunication techniques. More particularly, the present invention provides an integrated optical transceiver based on silicon-photonics platform. Merely by example, the present invention discloses an on-board, in-package optics light engine based on four integrated optical transceivers each configured with 4 CWDM channels plus 4 replicated CWDM channels, a compact light engine integrating multiple optical-electrical modules, and a multi-channel light engine having one switch device integrated with multiple compact optical-electrical modules in a co-packaged optics assembly for high-speed opto-electrical data communication up to total 51.2 Tbit/s, though other applications are possible.

In modern electrical interconnect systems, high-speed serial links have replaced parallel data buses, and serial link speed is rapidly increasing due to the evolution of CMOS technology. Internet bandwidth doubles almost every two years following Moore's Law. But Moore's Law is coming to an end in the next decade. Standard CMOS silicon transistors will stop scaling around 3 nm. And the internet bandwidth increasing due to process scaling will plateau. But Internet and mobile applications continuously demand a huge amount of bandwidth for transferring photo, video, music, and other multimedia files. This disclosure describes techniques and methods to improve the communication bandwidth beyond Moore's law.

In an embodiment, the present invention provides an integrated optical transceiver. The integrated optical transceiver includes a substrate member having a surface region, an optical input port, and an optical output port. Additionally, the integrated optical transceiver includes a transmitter unit provided on the surface region. The transmitter unit includes a set of four laser devices comprising four laser diode chips flip-mounted on the surface region and configured to output four laser lights respectively at four wavelengths centered at 1270 nm, 1290 nm, 1310 nm, and 1330 nm. The transmitter unit further includes a set of four power splitter devices coupled to the four laser lights to split each of the four laser lights to two portions leading to two replicated transmit paths. Each transmit path includes a set of four modulator devices formed in the surface region and respectively receiving corresponding one of the two portions of the four laser lights. Each transmit path further includes a driver device coupled to the set of four modulator devices and configured to drive each modulator device to modulate a respective one of the four laser lights. Additionally, each transmit path includes a multiplexer device in a planar light circuit disposed next to the substrate member and configured to couple the four laser lights and multiplex to one output light carrying the four wavelengths delivered to the optical output port. Furthermore, the integrated optical transceiver includes a receiver unit provided on the surface region with two replicated receive paths. Each receive path includes a demultiplexer device in the planar light circuit configured to receive an input light from the optical input port and demultiplex to four input optical signals with the four wavelengths. Each receive path further includes four input waveguides formed in the surface region coupled to the demultiplexer device to respectively receive the four input optical signals. Additionally, each receive path includes a photodetector device converted the four input optical signals to respective electrical signals and a transimpedance amplifier device coupled to the photodetector device to process the electrical signals to be transferred as electrical outputs. Moreover, the integrated optical transceiver includes a heterogeneous integration configured using the substrate member, the transmitter unit, and the receiver unit to form a single silicon photonics device.

In a specific embodiment, the present invention provides a compact light engine. The compact light engine includes a case having a periphery wall member coupled with a top lid member and a single printed circuit board configured as a bottom member. The compact light engine further includes four optical-electrical modules respectively disposed on the single printed circuit board. Each optical electrical module includes an integrated optical transceiver described herein. The integrated optical transceiver includes a transmitter unit and a receiver unit configured in a surface region of a silicon substrate. The transmitter unit includes four laser devices outputting four laser lights split to two replicated transmit paths and a driver device to drive four modulators to modulate the four laser lights per each transmit path coupled with an optical multiplexer device in a planar light circuit (PLC) based on a glass substrate to output a transmission light. The receiver unit includes two replicated receive paths. Each receive path includes a photodetector device and a trans-impedance amplifier device to detect four light signals inputted from an optical demultiplexer device in the PLC and convert the four light signals to respective electrical signals. Additionally, the compact light engine includes an input fiber cable coupled to each receive path with the optical demultiplexer device in the PLC per one of the four optical-electrical modules and an output fiber cable coupled to each transmit path with the optical multiplexer device in the PLC per the one of the four optical-electrical modules. The compact light engine further includes a first connector disposed at a side region of the periphery wall member to couple with two pairs of input fiber cables and output fiber cables respectively associated with two of the four optical-electrical modules. Furthermore, the compact light engine includes a second connector disposed at a side region of the periphery wall member to couple with two pairs of input fiber cables and output fiber cables respectively associated with other two of the four optical-electrical modules. Moreover, the compact light engine includes one or more ASIC chips configured on the printed circuit board and electrically coupled with the four optical-electrical modules.

In another specific embodiment, the present invention provides a multi-channel light engine in an optics assembly. The multi-channel light engine includes a common substrate member having a periphery region and a central region. The multi-channel light engine further includes a switch device disposed at the central region having a plurality of electrical interconnects embedded in the common substrate member. Additionally, the multi-channel light engine includes multiple compact light engines disposed along the periphery region to maximize useable spaces of the common substrate thereof. Each compact light engine is coupled with the switch device via one or more electrical interconnects of the plurality of electrical interconnects. Each compact light engine includes a case having a periphery wall member coupled with a bottom substrate member and a top lid member. Each compact light engine further includes four optical-electrical modules mounted on a single printed circuit board associated with the bottom substrate member, each optical electrical module comprising an integrated optical transceiver described herein. The integrated optical transceiver is configured in a surface region of a silicon substrate including two replicated transmit paths including four splitters splitting four laser devices outputting four laser lights to two replicated sets of four light signals respectively carrying four CWDM wavelengths. The integrated optical transceiver is configured in the surface region of the silicon substrate also including two replicated receive paths receiving two independent incoming light signals each carrying the four CWDM wavelengths. Each transmit path includes a driver device to drive four modulators to modulate one set of four light signals muxed by an optical multiplexer device planar light circuit (PLC) based on a glass substrate to output a transmission light. Each receive path includes a photodetector device and a trans-impedance amplifier device to detect light signals demuxed from one incoming light signal by an optical demultiplexer device in the PLC and convert the light signals to electrical signals. Additionally, each compact light engine includes a first fiber to couple with an input waveguide of the optical demultiplexer device in the PLC and a second fiber to couple with an output waveguide of the optical multiplexer device in the PLC. Furthermore, each compact light engine includes an optical connector integrated with the top lid member and located at one side of the periphery wall member to couple with each first fiber associated with each of the four optical-electrical modules and each second fiber associated with each of the four optical-electrical modules.

The present invention achieves these benefits and others in the context of known waveguide laser modulation technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1:
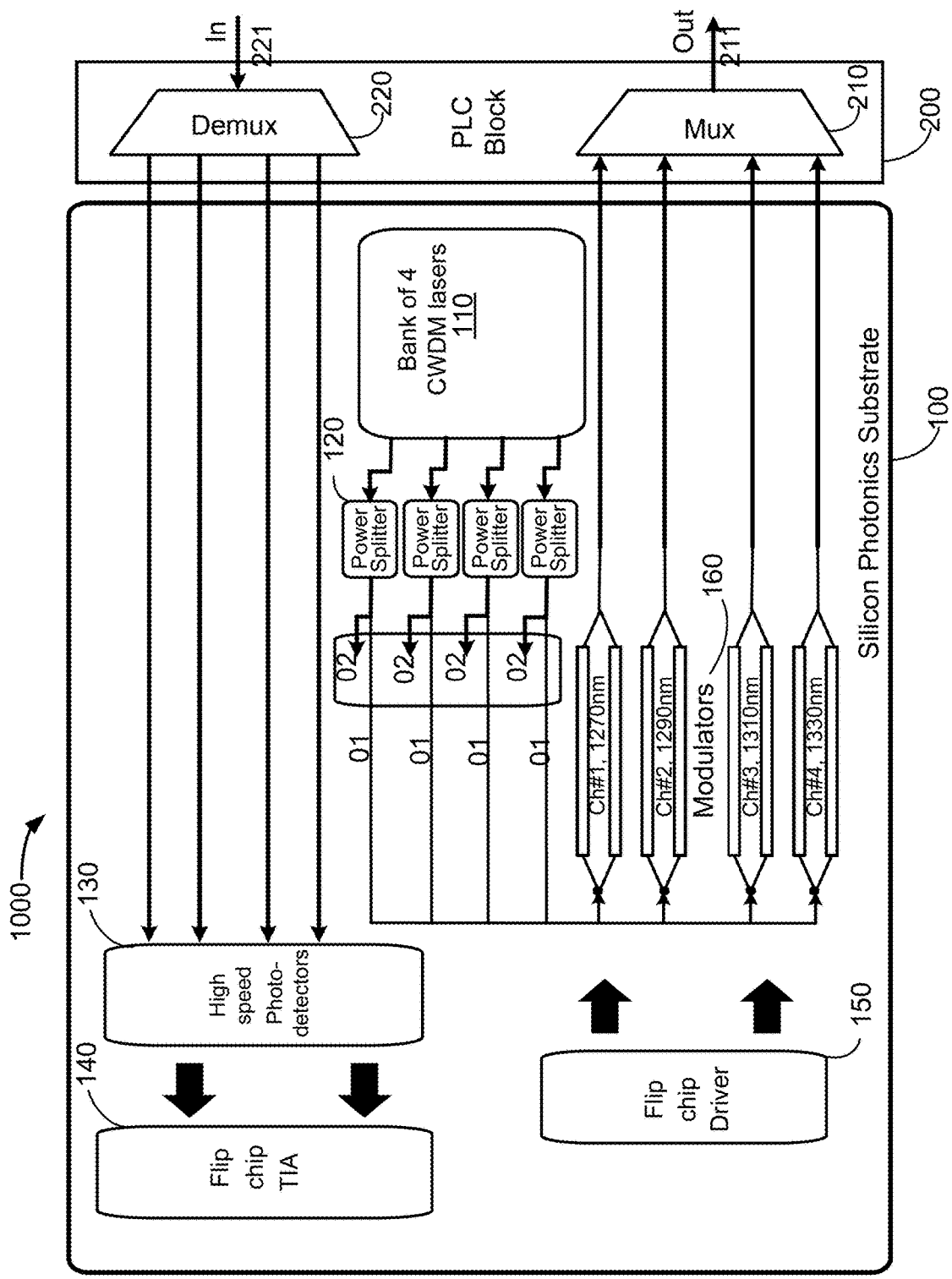
FIG. 1 is a simplified block diagram of an integrated compact optical transceiver according to an embodiment of the present invention.

The present invention relates to optical telecommunication techniques. More particularly, the present invention provides an integrated optical transceiver based on silicon-photonics platform. Merely by example, the present invention discloses an on-board, in-package optics light engine based on four integrated optical transceivers each configured with 4 CWDM channels, a compact light engine integrating multiple optical-electrical modules, and a multi-channel light engine having one switch device integrated with multiple compact optical-electrical modules in a co-packaged optics assembly for high-speed opto-electrical data communication up to total 51.2 Tbit/s, though other applications are possible.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter-clockwise have been used for convenience purposes only and are not intended to imply any particular fixed direction. Instead, they are used to reflect relative locations and/or directions between various portions of an object.

In an aspect, the present disclosure provides an integrated compact optical transceiver. As data transmission-capacities increase in WDM systems, demand on high-speed, compact optical transceiver based on silicon photonics platform increasingly attract more and more interest over the recent years. For example, a compact pluggable optical transceiver in QSFP form factor. Yet, the compact optical transceiver is still a stand-alone device that needs to be coupled with separate passive optical devices like mux/demux and one or more gear box or retimer to connect with an electrical switch device to form a functional light engine, which requires a fairly large package size and high power-consumption.

FIG. 1 shows a simplified block diagram of an integrated optical-electrical module according to an embodiment of the present invention. This diagram is merely an example, which should not unduly limit the scope of the claims. One of ordinary skill in the art would recognize many variations, alternatives, and modifications. As an embodiment shown in FIG. 1, the integrated optical-electrical module 1000 is formed by integrating a silicon photonics optical transceiver module 100 formed on a single silicon photonics substrate coupled with a planar light circuit (PLC) block 200. In the embodiment, the optical transceiver module 100 is a 4-channel integrated optical transceiver configured to receive four wide-wavelength inputs demultiplexed from one optical input 221 and output four CWDM channel wavelength multiplexed to one light output 211. Both a 4-to-1 multiplexer 210 and a 1-to-4 demultiplexer 220 are formed in the PLC block 200. Optionally, the PLC block 200 includes multiple optical waveguides formed in a glass substrate.

Referring to FIG. 1, the (one of the four) optical transceiver module 100 includes a bank of 4 CWDM lasers 110 respectively provide 4 CWDM channel light signals with wavelengths in 1270 nm, 1290 nm, 1310 nm, and 1330 nm. Optionally, each laser is a DFB laser. Optionally, each laser is provided as an individual laser chip flip-mounted on the silicon photonics substrate. Optionally, each light signal outputted from the respective one laser chip is coupled into a silicon waveguide built in the silicon photonics substrate. Each light signal, through the waveguide, is firstly coupled into a power splitter 120 to be split to two branches with a split ratio varying from 5:95 to 50:50. Optionally, the light signal from one minor split branch of the power splitter 120 is used for monitoring or wavelength locking or feedback control. Optionally, the light signal from one major split branch of the power splitter 120 is fed to one of four modulators 160. Optionally, for equally 50:50 splitting case, the light signal is converted to two replicated light signals respectively fed into a modulator. FIG. 1 only shows four modulators 160 respectively for four first branches (01) while four other modulators for the four second (replicated) branches (02) are not explicitly shown. Of course, there can be many functional setups to handle these light signals and configure in different manners for different applications of the optical-electrical module 100.

Optionally, the modulator 160 in any one of first branch 01 is a linear waveguide-based Mach-Zehnder modulation scheme. Each modulator 160 includes two waveguide branches with desired phase delay configured to match with respective one of four wavelengths 1270 nm, 1290 nm, 1310 nm, and 1330 nm of the four CWDM channels. A Driver module 150 is provided as an independently-built flip chip mounted on the same silicon photonics substrate. Optionally, a redundant driver module 150' (not shown in FIG. 1) is also provided as a flip-chip mounted on the same silicon photonics substrate for driving the other four modulators (which are not shown in FIG. 1). The driver module 150 is configured to drive all of the four modulators 160 to modulate the four channels of light signals respectively passing therethrough. Optionally, the driver module 150 employs PAM-N(N is an integer) modulation protocol or NRZ modulation protocol to modulate the light signal. For example, the modulators 160 are configured to provide PAM4 modulation though other formats can be employed. After modulation, the four channels of light signals are guided to a 4-to-1 multiplexer (Mux) 210 formed in the PLC block 200 which outputs a multiplexed light signal through a fiber (not shown) to the output port 211. Optionally, there is another 4-to-1 Mux formed in the PLC block 200 (yet not shown) for combining the other 4 replicated channels of light signals to one multiplexed light signal which is through another fiber (not shown) led to the output port 211. Effectively, a combination of the 4 lasers 110 and 4 or 8 modulators 160 driven by the driver module 150 or plus the driver module 150' (see FIG. 2) forms an integrated 4-ch optical transmit path plus another 4-ch replicated optical transmit path (not shown in FIG. 1).

Referring to FIG. 1, the optical transceiver module 100 includes a 4-ch optical receive path. In the path, the optical de-multiplexer (Demux) 220 in the PLC block 200 receives an incoming light signal from external network which is configured to operate under the four CWDM wavelengths for transmitting corresponding data signals. The incoming light signal is demultiplexed into 4 separate light signals in respective 4 channel wavelengths guided into respective four waveguides formed in the silicon photonics substrate. High-speed photodetectors are used to detect these four light signals separately and converted to respective electrical signals. In the embodiment, the 4-channel optical receive path of the optical transceiver module 100 also includes a trans-impedance amplifier TIA module 140 for independently processing the electrical signals converted from respective four separate light signals for communicating with host electrical network system. Optionally, the optical transceiver module 100 also includes a replicated 4-ch optical receive path as four replicated light signals can be demultiplexed from another incoming light by another demultiplexer. In the replicated 4-ch optical receive path, another trans-impedance amplifier TIA module 140' (not shown in FIG. 1) can be included for independently processing four electrical signals converted from respective four replicated light signals for communicating with host electrical network system with expanded bandwidth. Optionally, the TIA module 140 is provided as a flip chip mounted on the same silicon photonics substrate. Optionally, the TIA module 140' is a replicated flip chip mounted on the same silicon photonics substrate (see FIG. 2).

Optionally, the integrated coherent optical transceiver includes multiple silicon waveguides respectively laid in the silicon photonics substrate of the optical transceiver module 100 for connecting several different silicon photonics components including power splitter, photodetector, and modulator formed in the silicon photonics substrate, and passive optical multiplexer and demultiplexer in the PLC block 200. Optionally, the silicon waveguides have regular rectangular wire shape with a fixed width and height. Optionally, the height is selected based on a usage of standard 220 nm silicon-on-insulator (SOI) substrate during its formation process. Optionally, the silicon waveguides have alternative shaped structures like rib structure with multiple steps in height, taper structure with varying widths along its length, or multiple branches of different widths and separations joined at different cross-section planes, depending on specific functional applications. Optionally, some of the silicon photonics components mentioned above are also silicon waveguides themselves monolithically formed in a same manufacture process for preparing the silicon photonics substrate to integrate the optical transceiver module 100.

Figure 2:
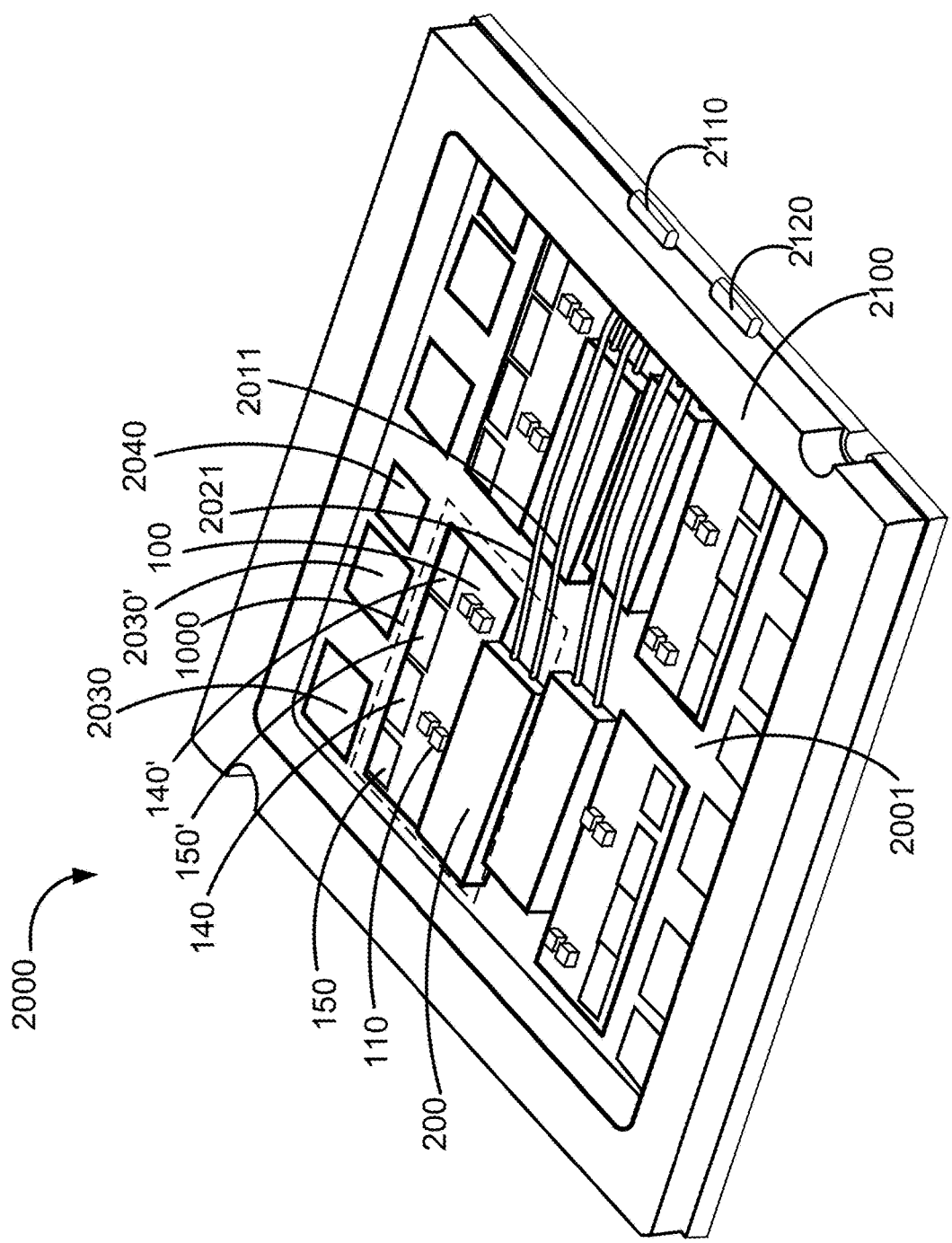
FIG. 2 shows a schematic perspective view of a compact light engine assembly integrating four optical-electrical modules according to an embodiment of the present invention.

In another aspect, the present disclosure provides a compact assembly of optical-electrical modules integrating multiple optical transceivers and PLC blocks in one common substrate in a sealed package. FIG. 2 shows a schematic perspective view of a compact light engine assembly integrating four optical-electrical modules according to an embodiment of the present invention. This diagram is merely an example, which should not unduly limit the scope of the claims. One of ordinary skill in the art would recognize many variations, alternatives, and modifications. As an embodiment shown in FIG. 2, the compact light engine 2000 is provided by integrating four optical-electrical modules 1000 based on silicon-photonics platform evenly packaged in four areas on a common printed circuit board (PCB) substrate 2001.

Each of the four optical-electrical modules 1000 in FIG. 2 is substantially a same one disclosed in the block diagram of FIG. 1 including a silicon photonics (SiPho) transceiver module 100 and a PLC block 200. The SiPho transceiver module 100 is formed on a single silicon photonics substrate including an optical transmission path with four laser chips 110 configured to independently output laser signals at respective four CWDM channel wavelengths, 1270 nm, 1290 nm, 1310 nm, and 1330 nm designed for data communication. The four laser signals outputted from the laser chips 110 are guided via built-in waveguides (not explicitly shown) to four modulators 160 which are also formed within the silicon photonics substrate of the SiPho module 100.

Optionally, each of the four laser signals outputted from the laser chips 110 is respectively split by a 50:50 splitter to two light signals respectively guided to two transmit paths (see FIG. 1). In one transmit path, the four light signals are passed through the four modulators 160 (FIG. 1) which are driven by a flip chip driver 150 (FIG. 1 and FIG. 2). In another replicated transmit path, other four light signals are passed through four other modulators 160' (not shown in FIG. 1) driven by another flip chip driver 150' (FIG. 2). Both the driver 150 and the driver 150' (FIG. 2) are interfaced with external electrical control system respectively through two digital signal processing (DSP) chips 2030 and 2030' as well a microcontroller chip 2040 mounted on the same PCB substrate 2001. The modulators 160 are configured to modulate the four light signals respectively from the laser chips and output corresponding modulated light signals to encode respective data therein to be transmitted. The modulators 160' independently modulate the four replicated light signals to output corresponding modulated light signals to encode respective (additional) data therein to be transmitted. Optionally, the digital signal processing chips 2030 and 2030' include gearbox for converting analog signal to digital signal, processor for processing the digital signals, interface device for communicating with external electrical network, and laser drivers for driving the four laser devices. Optionally, every controller chip 2040 is associated with a respective one optical-electrical module 1000 and is configured to drive the other chips and drivers therein. Optionally, the modulators 160 or 160' are configured to modulate the laser light signal based on PAM-N protocol, for example, PAM-4 protocol, or based on NRZ protocol.

The PLC block 200 associated with each of the four optical-electrical modules 1000 includes a first optical multiplexer (see FIG. 1) to multiplex the four light signals into one output light in an optical fiber and a second optical multiplexer to multiplex the four replicated light signals into another output light in another optical fiber. Both optical fibers can be packaged into one on-board fiber cable 2011 coupled between the PLC block 200 and a first optical port 2110 mounted on one side edge of an assembly wall structure 2100 of the compact light engine 2000. In fact, the first optical port 2110 also is packaged two other optical fibers carrying respective output lights from two transmit paths of another of the four optical-electrical modules 1000 in the compact light engine 2000. From the first port 2110, total four output light paths carrying 16 channel signals from two of the four optical-electrical modules 1000 can be delivered to external optical networks. In the embodiment, the compact light engine 2000 includes total four compact optical transceivers 1000. In a replicate fashion, four other output light paths carrying 16 channel signals received respectively from other two of the four optical-electrical modules 1000 in two on-board fiber cables (2011) are delivered through the second port 2120 to the external optical networks.

As each of the four optical-electrical modules 1000 provides two redundant transmit paths and each transmit path includes one set of four light channels that is multiplexed into one output, one optical transceiver in one of the four optical-electrical modules 1000 yields 8 light channels. Totally, the compact light engine 2000 offers 32 output light channels. As shown in FIG. 2, among the 32 output light channels, 16 of them from two of the four optical-electrical modules 1000 are delivered through the first port 2110 and 16 others from other two of the four optical-electrical modules 1000 are delivered through the second port 2120.

In the embodiment, the same one of the four optical-electrical modules 1000 (FIG. 2) also includes a built-in optical receive path in the SiPho transceiver module 100 configured to receive four light signals passed via an on-board fiber cable 2021 coupled from the PLC block 200 which has an optical demultiplexer to demultiplex an incoming light signal to four individual lights with respective four CWDM channel wavelengths. Each of the four individual lights is coupled from the PLC block 200 to the waveguides in the silicon photonics substrate to a photodetector block (referred to FIG. 1). The photodetector block individually detects and converts each light to an electrical current passed to and processed by a trans-impedance amplifier (TIA) module 140, which is a flip chip mounted on the same silicon photonics substrate, to generate a voltage signal. The voltage signal is further handled or digitized and processed by on-board Digital Signal Processing chip 2030 and fed to an external electrical receiver. The incoming light signal as mentioned above is received via an on-board fiber cable 2021 coupled to the first optical port 2110 which may be connected through an in-coming optical fiber from an external optical network.

Optionally, the same optical-electrical module 1000 includes a replicated optical receive path in the SiPho transceiver module 100. In this replicated path, another incoming light signal can be received via another fiber packaged in the same on-board fiber cable 2021 (from the first port 2110. The light signal is demultiplexed to four replicated light signals with respective four CWDM channel wavelengths which can be separately detected by photodetectors and corresponding electrical signals. The electrical signals can be processed by a replicated TIA module 140' that is mounted as flip chip on the same silicon photonics substrate. In this embodiment, PLC block 200 contains two 1-to-4 or one 1-to-8 demultiplexers to create two sets of four light paths. For the compact light engine 2000 containing four optical-electrical modules 1000, totally there are 32 input light channels associated with two optical ports (2110, 2120). Each port delivers 4 sets of input light channels respectively to two PLC blocks 200 respectively for two optical-electrical modules 1000. The two sets of the four sets of input light channels delivered to one PLC block 200 in respective one of the four optical-electrical modules 1000 are transported via two fibers packaged in one on-board fiber cable 2021 before being demultiplexed. These two sets of input light channels contain two replicated sets of four light signals carrying four CWDM channel wavelengths.

Figure 2A:
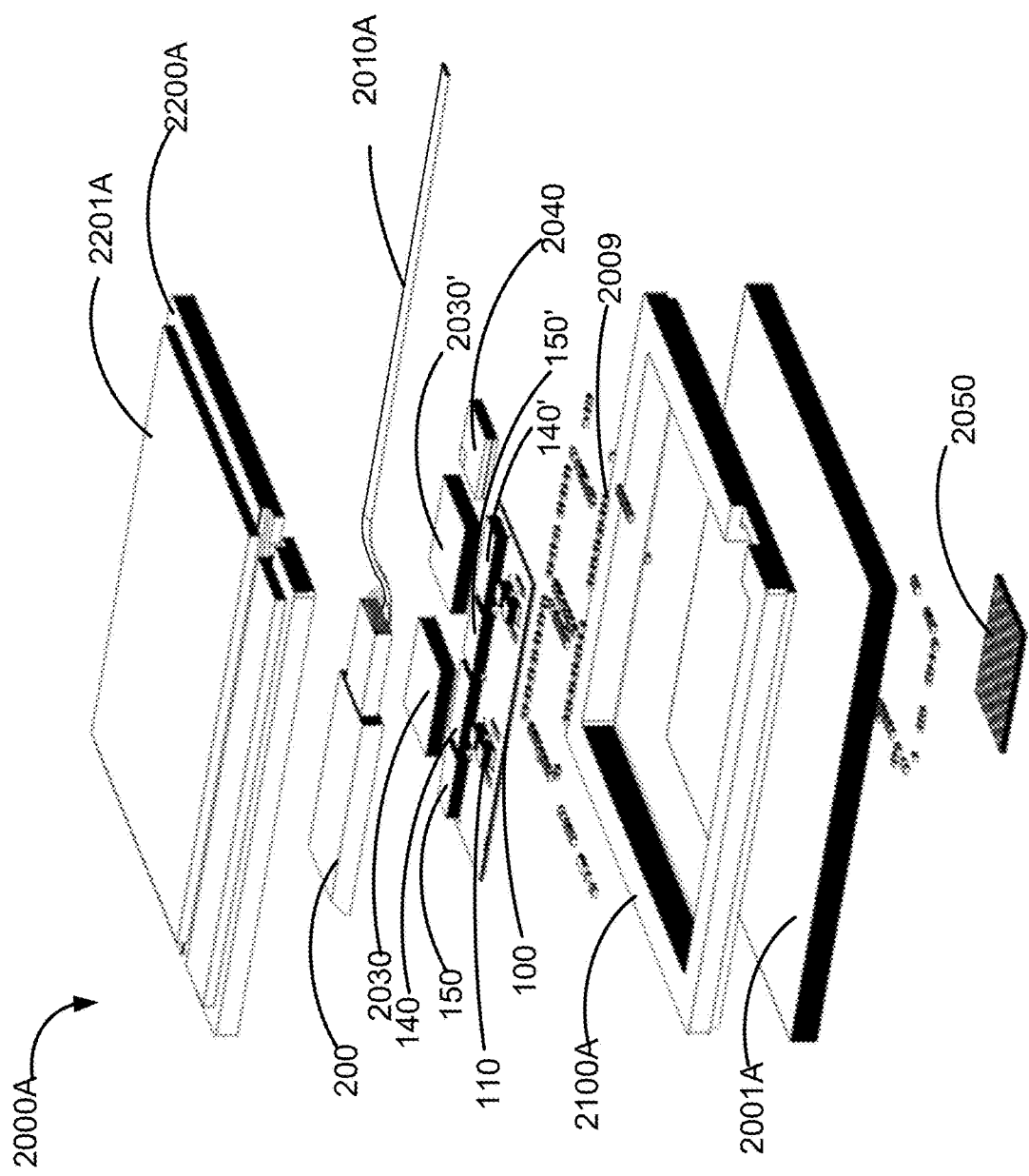
FIG. 2A shows a schematic explosive view of a package of a quarter assembly of a compact light engine according to an embodiment of the present invention.

FIG. 2A is an explosive diagram of a simplified version of a compact light engine of FIG. 2 according to an embodiment of the present disclosure. Referring to FIG. 2A, a compact light engine package 2000A, which is only one portion of the compact light engine 2000 of FIG. 2 with one optical-electrical module 1000 being illustrated in the explosive view. The package 2000A includes an assembly having a top lid member 2200A covering a peripheral side member 2100A located around a boundary of a printed circuit board (PCB) substrate 2001A. Optionally, the package 2000A is a quarter portion of an assembly of the compact light engine 2000. In FIG. 2, the top lid member 2200A was removed so that the features inside the package can be revealed. Yet, the top lid member 2200A may be placed to seal the assembly. Optionally, the seal is hermetic. Optionally, the top lid member 2200A contains a heat sink structure 2201A. Optionally, the heat sink structure 2201A is configured to form thermal contact with all four laser devices 110 in the package 2000A. The PCB substrate 2001A of the compact light engine package 2000 is served as a bottom member of the package 2000A. Optionally, the PCB substrate 2001A also is structured to allow heat being conducted effectively through a bottom member or another substrate in another assembly in higher system level.

In one embodiment, referring to FIG. 2A again, the optical-electrical module packaged in the compact light engine package 2000A includes a silicon photonics module 100 mounted on the PCB substrate 2001A. The silicon photonics module 100 provides a common silicon photonics substrate for mounting four laser devices 110, two replicated transimpedance amplifiers (TIA) 140 and 140' as well as two drivers 150 and 150'. Some other feature devices including optical modulators, optical splitters, optical detectors are all built in the same silicon photonics substrate associated with the silicon photonics module 100. The two TIA/Driver units in each optical-electrical module of the compact light engine package 2000A is configured to handle reception and transmission of signals in two replicated sets of 4 channels. Each channel is associated with a light signal in a CWDM channel wavelength. Optionally, the silicon photonics module 100 is formed as a single chip that is flip mounted on the PCB substrate 2001A.

In the embodiment, the optical-electrical module packaged in the compact light engine package 2000A also includes a PLC block 200 mounted on the PCB substrate 2001A along one side of the silicon photonics module 100. The PLC block 200 can be configured with multiple optical multiplexer or demultiplexer waveguide devices and coupling features based on a glass substrate to couple input or output light from optical fibers with planar light waveguides. Additionally, along another side of the silicon photonics module 100, one or more ASIC chips, for example, digital signal processing (DSP) chip(s) 2030(2030'), can be disposed and mounted as a flip chip on the PCB substrate 2001A. Each DSP chip 2030 or 2030' is configured to support functions of one TIA/driver unit including one TIA chip 140 and one driver chip 150 for processing or modulating optical/electrical signals involving a 4-ch transceiver path or another replicated TIA/driver unit including one TIA chip 140' and one driver chip 150' for processing or modulating optical/electrical signals involving another replicated 4-ch transceiver path. Optionally, although not shown, an optical power splitter, multiple (e.g., eight) modulators and photodetectors, can also be formed within a common substrate of the silicon photonics module 100. Furthermore, a microcontroller chip 2040 is also flip-mounted to the PCB substrate 2001A next to the DSP chip to support control functions of the optical-electrical module. The chip mounting, including mounting of the silicon photonics module 100, DSP chips 2030 (2030'), controller chip 2040, PLC block 200, is done by flip-chip mounting of pre-fabricated chip onto a front side of the PCB substrate 2001A via conductive bonding bumps 2009. Moreover, the PCB substrate 2001A, which is served as a quarter portion of bottom member of the package 2000A of the compact light engine 2000, also opens its bottom side for mounting additional functional chips for enhancing performance of the light engine. For example, additional ASIC chip 2050 is shown to be mounted at the bottom side of the PCB substrate 2001A via conductor-filed through-hole bumps 2009.

Figure 3:
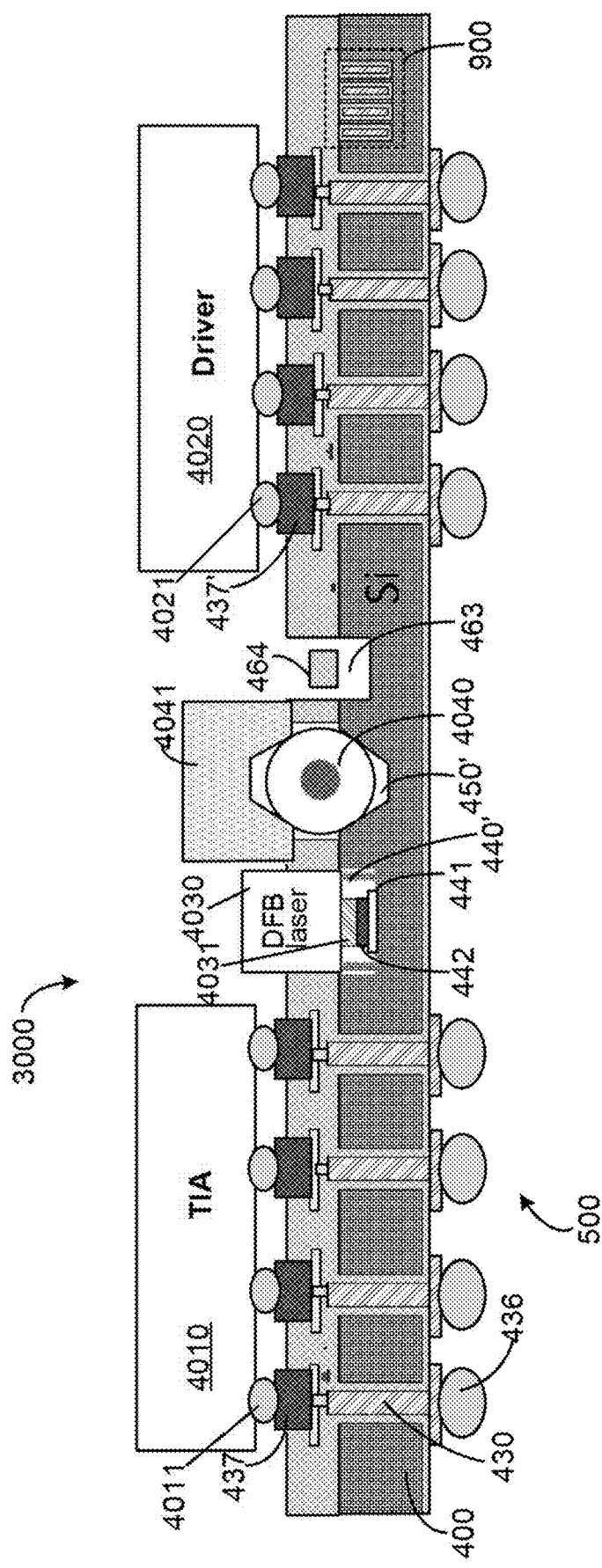
FIG. 3 is a schematic cross-sectional view of an optical-electrical module based on the silicon photonics TSV interposer according to an embodiment of the present invention.

In a specific aspect, the present disclosure provides a fabrication structure of a silicon-photonics optical module based on a silicon-photonics TSV interposer. Optionally, as an example, the SiPho transceiver module 2000 may be formed with the fabrication structure shown here though many alternatives or modifications can be made. FIG. 3 is a schematic sectional view of a SiPho transceiver module based on a silicon photonics TSV interposer according to an embodiment of the present invention. As shown, an optical-electrical module 3000 is provided in a single silicon photonics substrate. In an embodiment, each SiPho transceiver module 100 in FIG. 2 may be formed as the optical-electrical module 3000.

Referring to FIG. 3, the optical-electrical module 3000 includes a silicon substrate 400 including a front side and a back side and a plurality of through-silicon vias (TSVs) 430 formed in a first region of the silicon substrate 400. Each TSV 430 is configured to fill a conductor material ended with a conductive pad 437 at the front side and a conductive bump 436 at the back side. The optical-electrical module 3000 further includes a coupler 464 suspended over a cavity 463 in the front side. The cavity 463 is formed in a second region isolated from the first region after the plurality of TSVs 430 including the pads 437 and the conductive bumps 436 is formed.

Additionally, the optical-electrical module 3000 includes a laser device 4030 disposed in a trench 440' in the second region of the front side. Optionally, the laser device 4030 is a DFB laser having at least an electrode 4031 coupled directly with a solder pad 442 on an under-bump metallization structure 441 in the trench 440'.

Furthermore, the optical-electrical module 3000 includes a fiber 4040 installed in a V-groove 450' in the second region of the front side. The fiber 4040 is configured to couple with the coupler 464 and the laser device 4030. Optionally, the fiber 4040 is fixed by a lid 4041.

Moreover, the optical-electrical module 3000 includes one or more electrical IC chips having electrodes coupled directly with some pads 437 at the front side of the silicon photonics TSV interposer that electrically connected to some conductive bumps 436 at the back side through the conductive material in the plurality of TSVs 430. Optionally, the one or more electrical IC chips include a transimpedance amplifier (TIA) module 4010. Optionally, the TIA module is a flip chip having electrodes 4011 facing directly towards some conductive pads 437 on the front side of the silicon photonics TSV interposer to form direct electrical connection without any wirebonds. Optionally, the one or more electrical IC chips include a driver module 4020 configured as a flip chip with multiple electrodes 4021 facing directly towards some other conductive pads 430' on the front side of the silicon photonics TSV interposer to form direct electrical connection without any wirebonds. Optionally, the optical-electrical module 3000 further includes multiple multi-layer capacitors formed in the front side of the silicon photonics TSV interposer. Optionally, the optical-electrical module 3000 can be applied as an on-board module coupled together with a gear box or retimer module.

Figure 4A:
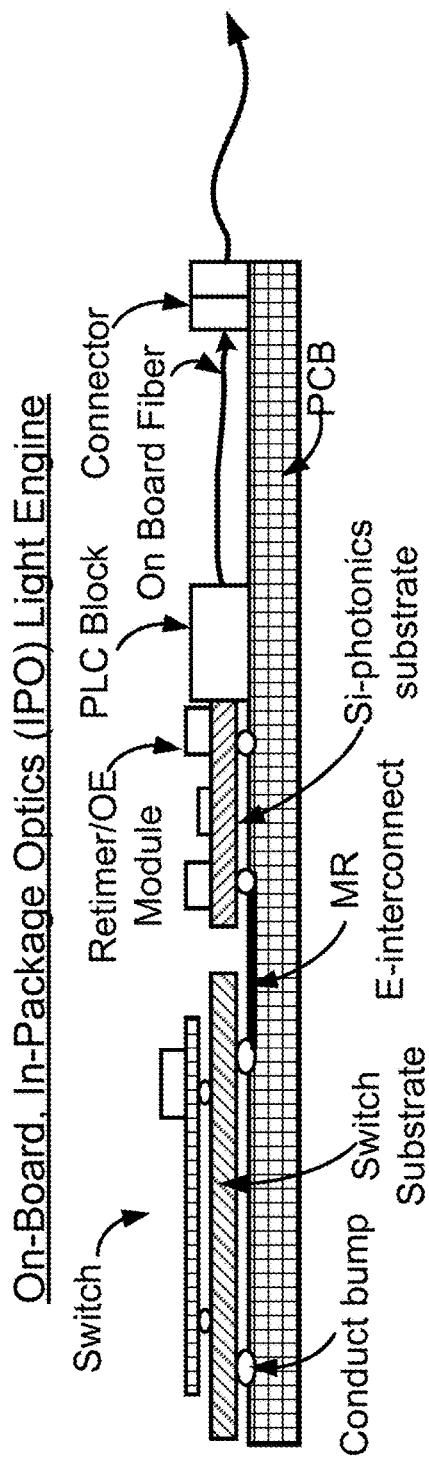
FIG. 4A is a schematic side view of a light engine with a switch co-mounted with an optical-electrical module in an on-board in-package optics assembly according to an embodiment of the present invention.

In yet another aspect, the present disclosure provides a light engine based on the silicon photonics on-board in-package optics assembly. FIG. 4A is a schematic side view of a light engine in an on-board in-package optics assembly according to an embodiment of the present invention. As shown, the light engine is provided with a switch device co-mounted on a same PCB with a Retimer/Optical-electrical module based on the silicon photonics TSV interposer and a planar light circuit (PLC) block described herein. Optionally the switch device is provided as a chip independently built and mounted on a printed circuit board (PCB) substrate through conductive bumps. Optionally, the switch device is configured to support high-speed multi-channel communication. Optionally, the Retimer/Optical-electrical module is at least partially based on the optical-electrical module 3000 shown in FIG. 3 integrated with the PLC block.

Optionally, the Retimer/Optical-electrical module is formed on a silicon photonics substrate which is directly mounted via conductive bumps on the same PCB shared with the switch device chip. The electrical coupling between the switch device chip and the electrical devices in the Retimer/Optical-electrical module is achieved by a median-reach (MR) electrical interface E-interconnect embedded in the PCB substrate.

Optionally, the Retimer/Optical-electrical module is optically coupled to passive optical devices (mux and demux) formed in the PLC block co-mounted on the PCB substrate. The PLC block is coupled via an on-board fiber to an optical connector. Optionally, one fiber serves an input fiber connected between an input port of an optical demux device in the PLC block and an input connector and one fiber serves an output fiber connected between an output port of an optical mux device in the PLC block and an output connector.

In some embodiments, the on-board in-package light engine assembly as shown in FIG. 4 is configured to couple with an external optical network to convert optical signal to electrical signal and to communicate through a XSR or USR electrical interface with low power consumption (1.0-2.0 pJ/bit) with an electrical network for data communication application.

Figure 4B:
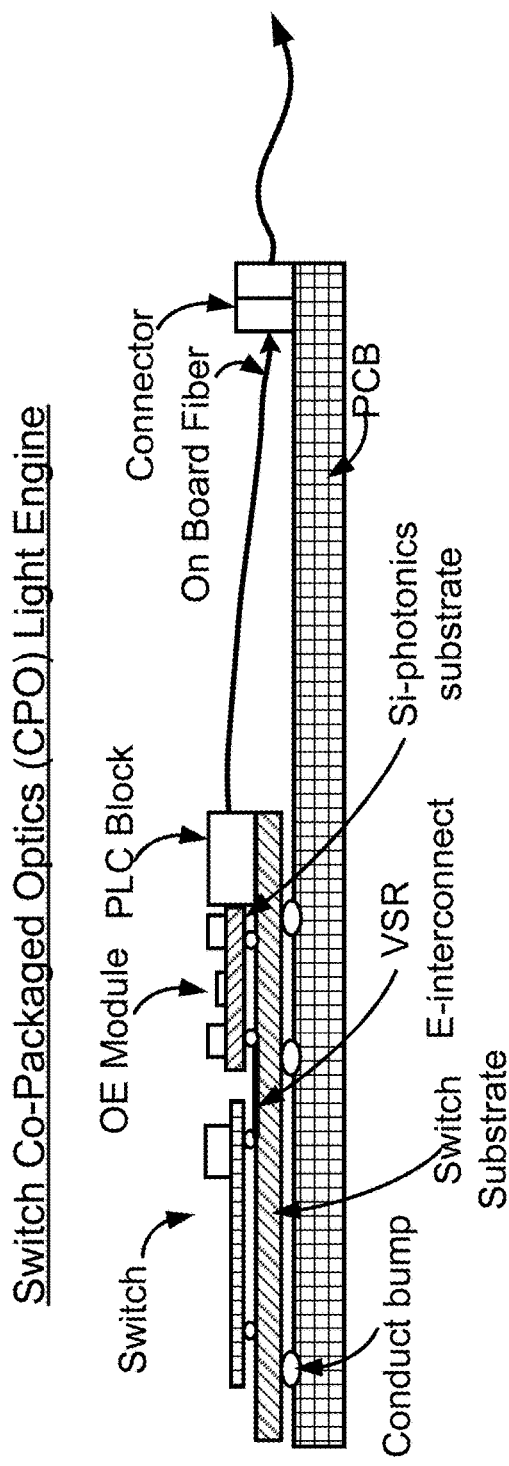
FIG. 4B is a schematic side view of a light engine with a switch co-integrated with an optical-electrical module in co-packaged optics assembly according to an embodiment of the present invention.

In still another aspect, the present disclosure provides a light engine based on the silicon photonics integrated with a switch in a co-packaged optics assembly. FIG. 4B is a schematic side view of a light engine with a switch co-integrated with an optical-electrical module in co-packaged optics assembly according to an embodiment of the present invention. As shown, the light engine is provided with a switch device co-integrated with the optical-electrical module based on the silicon photonics TSV interposer described herein and coupled with a PLC block. The light engine uses host FEC to draw control signals without using gear box and retimer module. The optical-electrical module combined with the PLC block is substantially a compact light engine 2000 shown in FIG. 2. On-board fibers may be needed to couple the PLC block in the light engine to an optical connector for connecting incoming fiber to receive an input light signal from or out-going fiber to deliver output light signal to an external optical network. The switch device contains multiple electrical channels (e.g., 512 channels) using Ultra-Short-Reach (USR) or Extra-Short-Reach (ESR) electrical interconnects to communicate with multiple (e.g., 32) optical-electrical modules in one setting. No gearbox or retimer is required for this light engine and FEC (forward error correction) function can be implemented by host. Power consumption associated with the light engine to communicate with external electrical network for data communication application can be lowered to 1.0 J/bit with a 56 G electrical interface.

Figure 5:
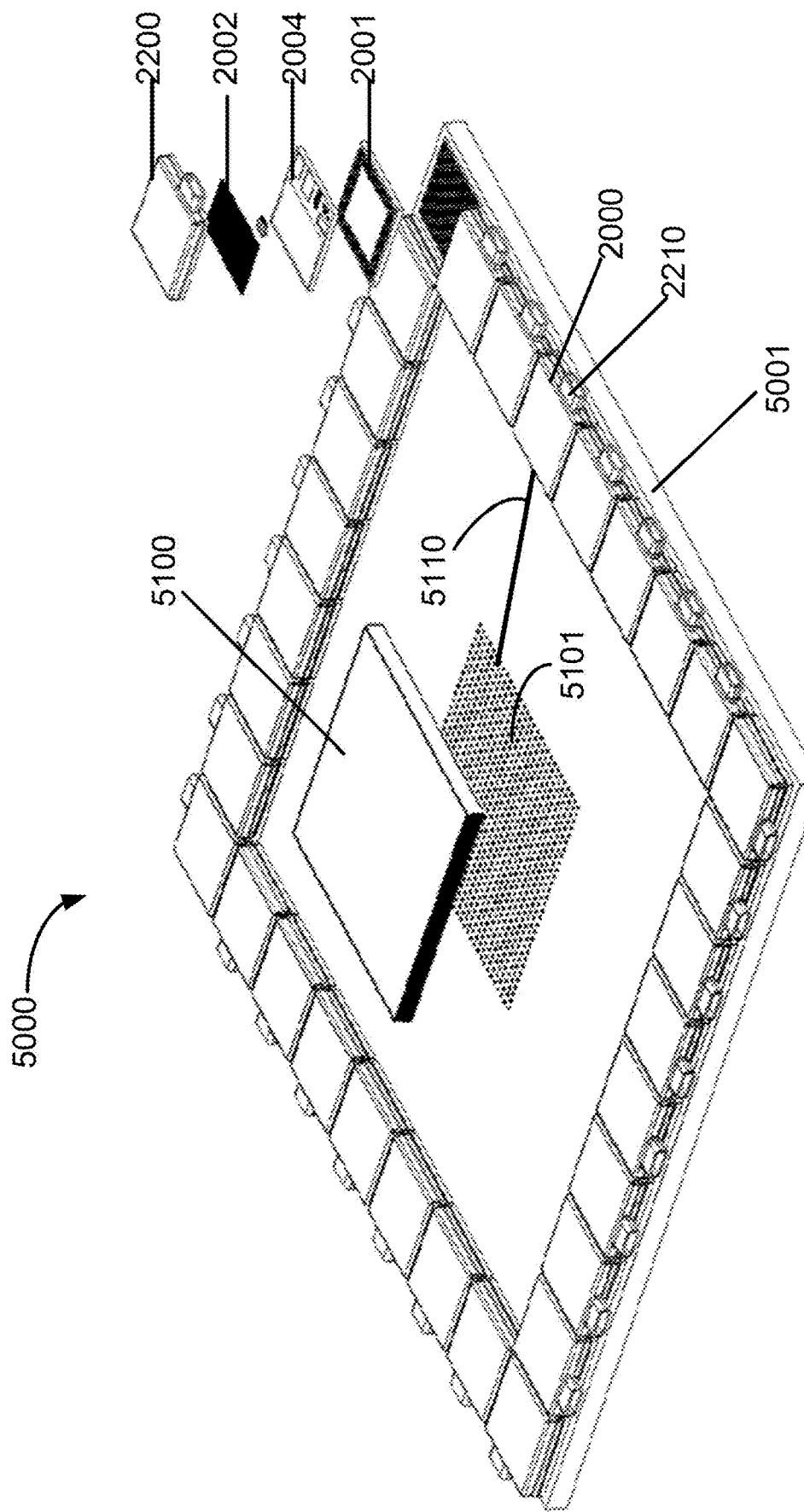
FIG. 5 is a schematic perspective view of a multi-channel integrated light engine including one switch device co-mounted with multiple compact light engines in an on-board in-package optics assembly according to an embodiment of the present invention.

In yet still another aspect, the present disclosure provides an integrated compact high-capacity light engine assembled on a same (switch) substrate according to a conceptual basis of a co-packaged optics assembly shown in FIG. 4B. FIG. 5 shows a schematic perspective view of a multi-channel integrated light engine including one switch device integrated with multiple compact light engines in a co-package optics assembly according to an embodiment of the present invention. This diagram is merely an example, which should not unduly limit the scope of the claims. One of ordinary skill in the art would recognize many variations, alternatives, and modifications. As an embodiment shown in FIG. 5, the multi-channel integrated light engine 5000 is provided by integrating one switch device 5100 with 32 compact light engines 2000 on a common printed circuit board (PCB) configured as a switch substrate 5001. In an embodiment, each compact light engine 2000 is substantially the same as one provided in FIG. 2.

Referring to FIG. 5, in an embodiment, the switch device is an independently built chip configured to support multi-channel electrical signal switching function and mounted in a central region 5101 on the switch substrate 5001. The switch device 5100 is configured to have a median-reach (MR) or short reach (SR) or ultra-short reach (USR) electrical interconnect 5110 through built-in conductive paths in the switch substrate 5001 for coupling with each individual one of 32 compact light engines 2000. Each compact light engine 2000 is arranged compactly along a peripheral region of the switch substrate 5001. Optionally, the switch substrate 5001 is a square shape with each side on average being disposed with 8 compact light engines 2000 to maximize usable space thereof. Optionally, the switch substrate 5001 for assembling 32 compact light engines at periphery region with a switch device in central region is configured to be in a compact size of 100 mm×100 mm or less.

Referring to FIG. 5, each compact light engine 2000 is assembled on the switch substrate 5001 by disposing first a light engine substrate 2001 on a respective designed periphery region of the switch substrate 5001. Optionally, the light engine substrate 2001 is a separate PCB substrate individually for assembling and testing this particular compact light engine 2000. In this case, the compact light engine 2000 (on which the silicon photonics substrate of the optical-electrical module 1000 is mounted) is co-mounted on the PCB substrate shared with the switch device 5100, making the multi-channel light engine 5000 an on-board in-package optics assembly. Optionally, the light engine substrate 2001 is just a part of the switch substrate 5001 itself, the compact light engine 2000 is co-integrated with the switch device 5100 on the same switch substrate. The silicon photonics substrate of four optical-electrical module 1000 in the compact light engine 2000 is directly mounted on the switch substrate 5001, making the multi-channel light engine a co-packaged optics assembly.

Referring to FIG. 5, on the light engine substrate 2001 (or optionally, the light engine substrate 2001 is part of the switch substrate 5001), one or more silicon photonics chips 2004 including multiple integrated laser chips are mounted on top coupling one or more PLC-based optical mux/demux devices. Optionally, the silicon photonics chip 2004 is configured to be a SiPho transceiver module 100 of FIG. 2 formed on a silicon photonics substrate fabricated using processes and structures disclosed in FIG. 3. Further on the silicon photonics substrate, single/dual CMOS chips 2002 with integrated TIA/Driver functional devices are mounted. Optionally, on-board optical fibers are included in this layer to connect the PLC blocks associated with one or more silicon photonics chips are also mounted on the silicon photonics substrate. Lastly, a lid member 2200 with an integrated optical connector 2210 is disposed on top to seal each compact light engine 2000.

Figure 6:
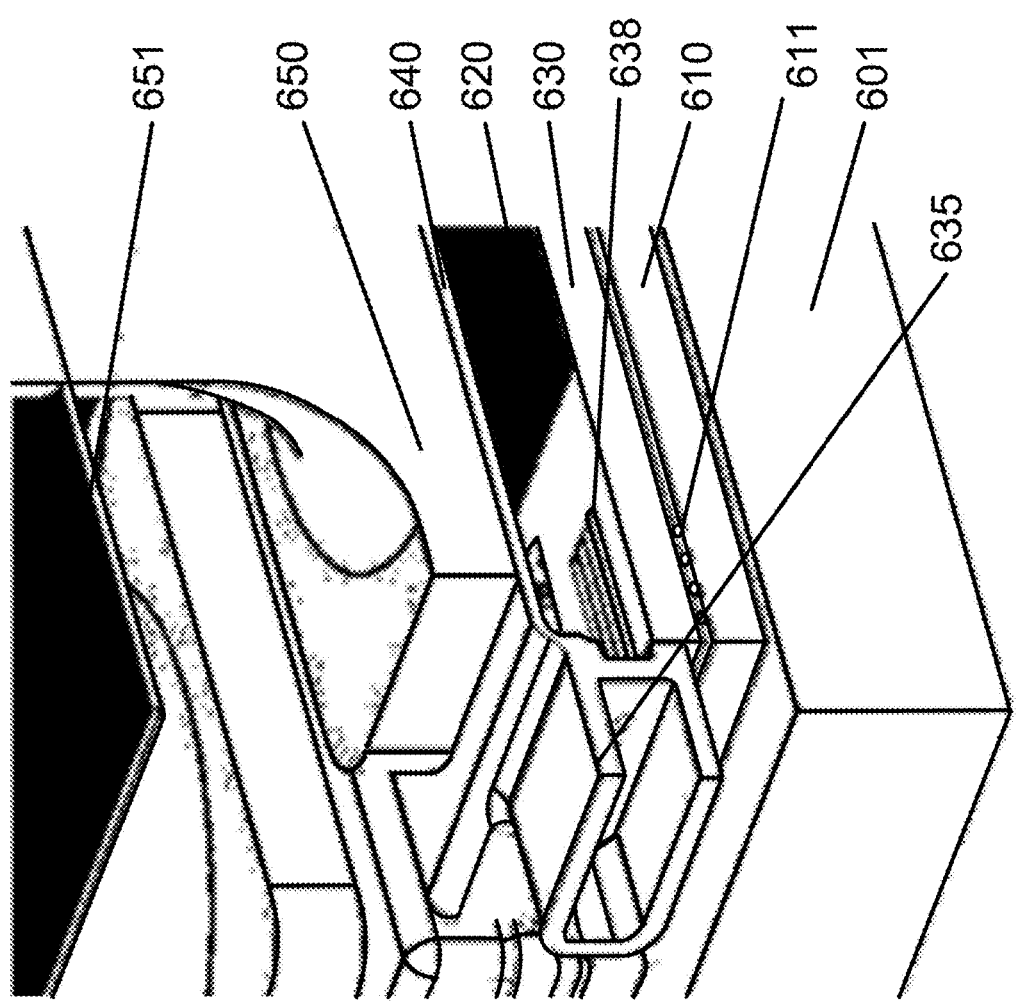
FIG. 6 is a simplified cross-sectional view of a section of the multi-channel light engine in the on-board in-package optics assembly according to an embodiment of the present invention.

FIG. 6 shows a simplified cross-sectional view of a section of the multi-channel light engine in the on-board in-package optics assembly according to an embodiment of the present invention. This diagram is merely an example, which should not unduly limit the scope of the claims. One of ordinary skill in the art would recognize many variations, alternatives, and modifications. As shown, some structure features of the assembly are revealed including a portion of the switch substrate 601 which serves a printed circuit board for the integrated light engine 5000. It also shows a light engine substrate 610 attached on top of the switch substrate 601, which serves a printed circuit board for the compact light engine 2000. Optionally, the light engine substrate 610 is not needed. Optionally, the light engine substrate 610 and the switch substrate 601 are a same substrate. A silicon photonics substrate 630 is shown to be mounted on the light engine substrate 610 and coupled electrically by some conductive slugs 611. Optionally, the slugs 611 are made by copper. On the silicon photonics substrate 630, an ASIC chip 620 including TIA chip or Driver chip is mounted. Laser chips (not shown) for forming the compact light engine 2000 is also mounted on the silicon photonics substrate 630. Also shown, several waveguides 638 are formed in the silicon photonics substrate 630 to couple with the optical connector 635 for either receiving or outputting light signals. The optical connector 635 is integrated with a lid member 640, optionally, made by steel or other metal materials. On the lid member 640, a copper-based heatsink 650 can be formed to allow good thermal conduction to release heat generated by the laser chips or other ASIC chips (DSP 2030, 2030', controller 2040, ASIC 2050) in the compact light engine 2000. Optionally, the heatsink 650 includes fin structure 651.

Referring back to the FIG. 5, the multi-channel light engine 5000 assembles 32 compact light engines 2100. Each compact light engine 2100 provides 1.6 Tbit/s data capacity, yielding a total 51.2 Tbit/s capacity. In particular, each compact light engine 2100 includes 4 SiPho transceiver modules 100. Each transceiver module has 4 channels in CWDM optical wavelengths and electrical inputs of 32 lanes. Assuming that a module input channel speed of 25 Gbit/s, a reverse gearbox is needed to go from the switch with 256 channels×50 Gbit/s to 25 Git/s and a total module capacity of 800 Gbit/s can be provided with PAM4 modulation. In the case shown in FIG. 5, with the module input channel speed being 50 Gbit/s, a switch with 512 channels×50 Gbit/s will provide total module capacity of 1600 Gbit/s with PAM4 modulation. With the module input channel speed being increased to 100 Gbit/s, the total module capacity can even reach 3200 Gbit/s with PAM4 modulation.

Optionally, the multi-channel light engine formed on the common substrate member is part of a switch system apparatus. The switch system apparatus is spatially disposed in a data center. Optionally, the data center is configured for a social networking platform, an electronic commerce platform, an artificial intelligence platform, or a human tracking platform. Optionally, the data center is coupled to a plurality of data centers spatially located throughout a geographical region. Optionally, the data center is owned by a commercial company or a government entity. Optionally, the common substrate member comprises a printed circuit board configured with an electrical interface to a system board member, an optical interface to the system board member, and a mechanical interface to the system board member.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. An integrated optical transceiver comprising:
a substrate member having a surface region;
an optical input port;
an optical output port;
a transmitter unit provided on the surface region and comprising:
a set of four laser devices comprising four laser diode chips flip-mounted on the surface region and configured to output four laser lights respectively at four wavelengths centered at 1270 nm, 1290 nm, 1310 nm, and 1330 nm;
a set of four power splitter devices coupled to the four laser lights to split each of the four laser lights to two portions leading to two replicated transmit paths, each transmit path including,
a set of four modulator devices formed in the surface region and respectively receiving corresponding one of the two portions of the four laser lights;
a driver device coupled to the set of four modulator devices and configured to drive each modulator device to modulate a respective one of the four laser lights;
a multiplexer device in a planar light circuit disposed next to the substrate member and configured to couple the four laser lights and multiplex to one output light carrying the four wavelengths delivered to the optical output port;
a receiver unit provided on the surface region with two replicated receive paths, each receive path comprising:
a demultiplexer device in the planar light circuit configured to receive an input light from the optical input port and demultiplex to four input optical signals with the four wavelengths;
four input waveguides formed in the surface region coupled to the demultiplexer device to respectively receive the four input optical signals;
a photodetector device converted the four input optical signals to respective electrical signals; and
a transimpedance amplifier device coupled to the photodetector device to process the electrical signals to be transferred as electrical outputs; and
a heterogeneous integration configured using the substrate member, the transmitter unit, and the receiver unit to form a single silicon photonics device.

2. The integrated optical transceiver of claim 1 wherein the substrate member is a silicon photonics substrate and the planar light circuit comprises a glass substrate.

3. The integrated optical transceiver of claim 1 wherein the laser diode chip comprises a DFB laser.

4. The integrated optical transceiver of claim 1 wherein the modulator device comprises a Mach-Zehnder interferometer based on two branches of silicon-based waveguides.

5. The integrated coherent transceiver of claim 4 wherein the modulator device is configured to modulate the laser light in PAM-N or NRZ modulation protocol.

6. The integrated optical transceiver of claim 1 wherein the driver device comprises a CMOS chip that is flipped to mount on the surface region of the substrate member.

7. The integrated optical transceiver of claim 6 wherein the driver device comprises 4 channels with an electrical input channel speed of 25 Gbit/s.

8. The integrated optical transceiver of claim 6 wherein the driver device comprises 4 channels with an electrical input channel speed of 50 Gbit/s.

9. The integrated optical transceiver of claim 6 wherein the driver device comprises 4 channels with an electrical input channel speed of 100 Gbit/s.

10. The integrated optical transceiver of claim 1 wherein the power splitter device comprises a waveguide-based direct coupler embedded within the surface region.

11. The integrated optical transceiver of claim 1 wherein the transimpedance amplifier device comprises a CMOS chip that is flipped to mount on the surface region of the substrate member.

12. A compact light engine comprising:
a case having a periphery wall member coupled with a top lid member and a single printed circuit board configured as a bottom member;
four optical-electrical modules respectively disposed on the single printed circuit board, each optical electrical module comprising an integrated optical transceiver of claim 1 including a transmitter unit and a receiver unit configured in a surface region of a silicon substrate, the transmitter unit including four laser devices outputting four laser lights split to two replicated transmit paths and a driver device to drive four modulators to modulate the four laser lights per each transmit path coupled with an optical multiplexer device in a planar light circuit (PLC) based on a glass substrate to output a transmission light, the receiver unit including two replicated receive paths, each receive path including a photodetector device and a trans-impedance amplifier device to detect four light signals inputted from an optical demultiplexer device in the PLC and convert the four light signals to respective electrical signals;
an input fiber cable coupled to each receive path with the optical demultiplexer device in the PLC per one of the four optical-electrical modules and an output fiber cable coupled to each transmit path with the optical multiplexer device in the PLC per the one of the four optical-electrical modules;
a first connector disposed at a side region of the periphery wall member to couple with two pairs of input fiber cables and output fiber cables respectively associated with two of the four optical-electrical modules;
a second connector disposed at a side region of the periphery wall member to couple with two pairs of input fiber cables and output fiber cables respectively associated with other two of the four optical-electrical modules; and
one or more ASIC chips configured on the printed circuit board and electrically coupled with the four optical-electrical modules.

13. The compact light engine of claim 12 wherein each optical electrical module comprises 4 optical channels plus 4 replicated optical channels, each optical channel being associated with a wavelength determined by one of the four laser lights in respective one of 1270 nm 1290 nm, 1310 nm, and 1330 nm outputted from the four laser devices.

14. The compact light engine of claim 12 wherein the modulator device comprises a Mach-Zehnder interferometer based on two branches of silicon waveguides formed in the silicon substrate.

15. The compact light engine of claim 14 wherein the modulator device is configured to modulate the laser light in NRZ modulation protocol or a PAM-N modulation protocol, where N is an integer.

16. The compact light engine of claim 12 wherein the driver device comprises a CMOS chip that is flipped to mount on the silicon substrate.

17. The compact light engine of claim 16 wherein the driver device comprises 32 channels with an electrical input channel speed of 25 Gbit/s NRZ to provide total 800 Gbit/s data transceiving capacity per one optical-electrical module.

18. The compact light engine of claim 16 wherein the driver device comprises 32 channels with an electrical input channel speed of 50 Gbit/s to provide total 1.6 Tbit/s data transceiving capacity per one optical-electrical module.

19. The compact light engine of claim 16 wherein the driver device comprises 32 channels with an electrical input channel speed of 100 Gbit/s to provide total 3.2 Tbit/s data transceiving capacity per one optical-electrical module.

20. The compact light engine of claim 12 wherein the transimpedance amplifier device comprises a CMOS chip that is flipped to mount on the silicon substrate.

21. The compact light engine of claim 12 wherein the one or more ASIC chips comprises gearbox for converting analog signal to digital signal, processor for processing the digital signals, interface device for communicating with external electrical network, and laser drivers for driving the four laser devices.

22. The compact light engine of claim 12 wherein the one or more ASIC chips comprises one or more digital signal processing chips and micro-controller chip mounted on a front side of the printed circuit board.

23. The compact light engine of claim 12 wherein the one or more ASIC chips are mounted on a back side of the printed circuit board.

24. The compact light engine of claim 12 wherein the top lid member comprises a heat sink forming a thermal contact with all four laser devices in each of the four optical-electrical modules.

25. A multi-channel light engine in an optics assembly comprising:
a common substrate member comprising a periphery region and a central region;
a switch device disposed at the central region having a plurality of electrical interconnects embedded in the common substrate member;
multiple compact light engines disposed along the periphery region to maximize useable spaces of the common substrate thereof, each compact light engine being coupled with the switch device via one or more electrical interconnects of the plurality of electrical interconnects, each compact light engine comprising:
a case having a periphery wall member coupled with a bottom substrate member and a top lid member;
four optical-electrical modules mounted on a single printed circuit board associated with the bottom substrate member, each optical electrical module comprising an integrated optical transceiver of claim 1 configured in a surface region of a silicon substrate including two replicated transmit paths including four splitters splitting four laser lights from four laser devices to two replicated sets of four light signals respectively carrying four CWDM wavelengths, and two replicated receive paths receiving two independent incoming light signals each carrying four CWDM wavelengths, each transmit path including a driver device to drive four modulators to modulate one set of four light signals muxed by an optical multiplexer device planar light circuit (PLC) based on a glass substrate to output a transmission light, each receive path including a photodetector device and a trans-impedance amplifier device to detect light signals demuxed from one incoming light signals by an optical demultiplexer device in the PLC and convert the light signals to electrical signals;

a first fiber to couple with an input waveguide of the optical demultiplexer device in the PLC and a second fiber to couple with an output waveguide of the optical multiplexer device in the PLC;

an optical connector integrated with the top lid member and located at one side of the periphery wall member to couple with each first fiber associated with each of the four optical-electrical modules and each second fiber associated with each of the four optical-electrical modules.

26. The multi-channel light engine of claim 25 wherein the single printed circuit board associated with each optical-electrical module of each compact light engine is mounted on the common substrate member.

27. The multi-channel light engine of claim 26 wherein each of the compact light engine is associated with a retimer ASIC chip configured on the single printed circuit board.

28. The multi-channel light engine of claim 25 wherein the single printed circuit board associated with each optical-electrical module of each compact light engine is part of the same common substrate member.

29. The multi-channel light engine of claim 25 wherein each of the multiple electrical interconnects between the switch device and the respective of the multiple compact light engines comprises a MR interconnect, or a SR interconnect, or USR interconnect, or XSR interconnect.

30. The multi-channel light engine of claim 25 wherein the multiple compact light engines disposed along the periphery region comprises 32 compact light engines packed along the periphery region of the common substrate member in a square shape.

31. The multi-channel light engine of claim 30 wherein the common substrate in square shape has a size of 100 mm×100 mm or less.

32. The multi-channel light engine of claim 25 wherein the switch device comprises 256 or 512 electrical input channels, each channel being configured with a channel speed of 25 Gbit/s, or 50 Gbit/s, or 100 Gbit/s.

33. The multi-channel light engine of claim 25 wherein the common substrate member is a substrate for a switch system apparatus, the switch system apparatus being spatially disposed in a data center.

34. The multi-channel light engine of claim 33 wherein the data center is configured for a social networking platform, an electronic commerce platform, an artificial intelligence platform, or a human tracking platform.

35. The multi-channel light engine of claim 33 wherein the data center is coupled to a plurality of data centers spatially located throughout a geographical region.

36. The multi-channel light engine of claim 33 wherein the data center is owned by a commercial company or a government entity.

37. The multi-channel light engine of claim 25 wherein the common substrate member comprises a printed circuit board configured with an electrical interface to a system board member, an optical interface to the system board member, and a mechanical interface to the system board member.

38. The multi-channel light engine of claim 25 wherein the top lid member of each compact light engine comprises a heat sink structure configured with a thermal contact with at least all laser devices in each of four optical-electrical modules.

* * * * *